US006509814B2

(12) United States Patent
Milsom

(10) Patent No.: US 6,509,814 B2
(45) Date of Patent: Jan. 21, 2003

(54) BULK ACOUSTIC WAVE FILTER WITH OPTIMIZED SERIES AND SHUNT RESONATOR STATIC CAPACITANCES

(75) Inventor: Robert F. Milsom, Redhill (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/882,086

(22) Filed: Jun. 15, 2001

(65) Prior Publication Data

US 2001/0052831 A1 Dec. 20, 2001

(30) Foreign Application Priority Data

Jun. 16, 2000 (GB) .............................. 0014630

(51) Int. Cl.[7] ............................ H03H 9/205; H03H 9/56
(52) U.S. Cl. ...................................... 333/189; 333/191
(58) Field of Search ........................ 333/133, 186–192

(56) References Cited

U.S. PATENT DOCUMENTS

| | | | | |
|---|---|---|---|---|
| 5,077,544 A | | 12/1991 | Ogawa et al. ............... | 333/189 |
| 5,332,982 A | | 7/1994 | Kawakami ................... | 333/189 |
| 5,471,178 A | | 11/1995 | Hickernell ................... | 333/193 |
| 5,574,414 A | * | 11/1996 | Ogawa et al. ............... | 333/189 |
| 5,910,756 A | * | 6/1999 | Ella ........................ | 333/189 X |
| 5,949,306 A | * | 9/1999 | Hickernell ................... | 333/195 |
| 6,377,136 B1 | * | 4/2002 | Rittenhouse et al. ........ | 333/188 |

FOREIGN PATENT DOCUMENTS

| | | | |
|---|---|---|---|
| EP | 0669713 A1 | 8/1995 | |
| JP | 63-253711 | * 10/1988 | ................. 333/187 |
| WO | WO 01/91290 | * 11/2001 | |

OTHER PUBLICATIONS

K.M. Lakin et al.; "Solidly Mounted Resonators and Filters"; *1995 IEEE Ultrasonics Symposium, Proceedings*; vol. 2, pp. 905–908, Nov., 1995.*
K.M. Lakin et al.; "Thin Film Bulk Acoustic Wave Filters for GPS", *1992 IEEE Ultrasonics Symposium, Proceedings*; vol. 1, pp. 471–476, Oct., 1992.*
L. Mang et al.; "Thin–Film Resonator Ladder Filter"; *1995 IEEE MTT–S Microwave Symposium Digest*; vol. 2, pp. 887–890, May, 1995.*

* cited by examiner

*Primary Examiner*—Benny Lee
*Assistant Examiner*—Barbara Summons
(74) *Attorney, Agent, or Firm*—Steve R. Biren

(57) ABSTRACT

A ladder filter comprises series and shunt resonators (2, 4). The or each shunt resonator (4) has a static capacitance which is more than four times the static capacitance of the input or output series resonators (2i, 2o). This provides increased shunt resonator capacitance which reduces the effective coupling across the a series-shunt section, thereby enabling a smaller number of series-shunt filter sections to used to achieve good stop-band rejection, while still providing good performance in the pass-band. The invention is based on the recognition that filter bandwidth can be traded for improved out-of-band rejection.

9 Claims, 4 Drawing Sheets

BULK ACOUSTIC WAVE FILTER WITH OPTIMIZED SERIES AND SHUNT RESONATOR STATIC CAPACITANCES

BACKGROUND OF THE INVENTION

This invention relates to filters, and in particular to filters constructed using bulk acoustic wave resonators. Such filters may be used in communications equipment as band pass filters which enable selection of a frequency band in which transmission channels are located, and with rejection of frequencies outside the band of interest. The invention also relates to communications equipment (for example, a radio frequency receiver and/or transmitter) comprising such filters.

High-performance radio-frequency (RF) filters typically use high dielectric constant ceramic resonators or surface acoustic wave resonators. The former devices are rather bulky, whereas the latter are smaller but have higher insertion loss (generally>3 dB) and generally rather poor stopbands. As a result, neither provides an ideal solution for channel band selection in small communications devices such as mobile phones. Filters for such applications need deep stop-bands to reject unwanted signals, as well as low pass-band insertion loss (typically<2 dB) to achieve adequate signal-to-noise ratio. There is therefore a requirement for very small resonators with high Q-factor (typically>500). To achieve this aim, with potential for integration on silicon, thin-film bulk-acoustic-wave (BAW) resonators have been proposed. These are applicable to the frequency range 0.5 to 10 GHz, and are therefore appropriate for the third generation mobile telephony standard, as well as for already established wireless standards, such as GSM, W-CDMA, Bluetooth, HomeRF, DECT and GPS.

The need for low insertion loss and high stop-band attenuation can not be achieved with a single resonator. Filters are therefore typically made up of a number of resonators, and a conventional thin-film BAW filter configuration is a ladder construction, shown in simplified schematic form in FIG. 1. This has alternating series sections 2 and shunt sections 4, each of which can be a single resonator, or one or more resonators on the same frequency connected in series or parallel (which is electrically equivalent). The anti-resonant frequency of the shunt element is chosen to be the resonant frequency of the series elements to provide minimum insertion loss at that frequency.

The individual resonators are typically arranged as so-called solidly-mounted resonators (SMRs), an example of which is illustrated in FIG. 2. The required conversion between electrical and mechanical energy is achieved by a layer of piezoelectric material 10 (for example zinc oxide, aluminium nitride, PZT, PLZT) between two metal layers 12, 14 in which electrodes are formed. The piezoelectric material 10 is provided over one or more acoustically mismatched layers 16, which are mounted on an insulating substrate 18, for example glass. The acoustically mismatched layers act to reflect the acoustic wave which results from resonance of the piezoelectric layer 10 at the resonant frequency.

In FIG. 2, a number of high impedance layers 16a and low impedance layers 16b are shown. Porous silicon oxide (aerogel) may be used for the low-impedance 16b layers, and a single layer may in fact be adequate to achieve sufficiently high Q, due to the very low acoustic impedance of this material. The high impedance layers 16a may comprise tungsten.

In FIG. 2, the upper metal layer 12 defines both terminals 12a, 12b of the resonator, and the lower metal layer 14 effectively acts as an intermediate electrode between two series-connected resonators. This avoids the need to make electrical contact to the lower metal layer 14 through the piezoelectric layer 10. A single pair of series-connected resonators then acts as the basic building block of the filter and may be considered as the basic resonator element. FIG. 2 also shows a plan view, with contact pads 20 providing the input and output of the device.

Ladder filter arrangements such as shown in FIG. 1 have demonstrated good performance, for example less than 2 dB insertion loss and very low-level of spurious response. However, there are also some disadvantages, which can be understood from an approximate electrical equivalent circuit of the resonator, shown in FIG. 3.

$C_o$ is an (unwanted) static capacitance of the resonator, whereas $C_m$, $L_m$ and $R_m$ characterise the mechanical resonance. These are, respectively, the motional capacitance, motional inductance and motional resistance of the resonator. The resonator appears as a pure capacitor $C_o$ at frequencies removed from the resonance (except at other significant mechanical resonances such as harmonics, which are not accounted for in this simple model). In designs reported to date, the shunt and series resonators have similar areas, and therefore similar static capacitances. This gives only about 6 dB attenuation, in the frequency bands to be rejected by the filter (the "stop-band"), per combination of series and shunt sections. This is the result of the static capacitance of each resonator. A T-section, comprising two series-connected resonators and an intermediate shunt resonator may can be considered as the basic building block of a ladder filter. A single resonator element 2i, 2o (FIG. 1) is then at the input 6 and output 8 of the filter, and the intermediate series resonators elements 2b each comprise two series-connected resonator elements.

To achieve the desired low pass-band insertion loss and high stop-band insertion loss, each individual building block should meet these two requirements. Although increasing the number of sections adds to the stopband loss (as required), this also increases pass-band loss (and also the overall filter size). The pass-band and stop-band requirements therefore conflict with each other. Typically, several such building blocks are required for even moderate stop-band rejection. Consequently, both the area occupied and the insertion loss in the pass-band are increased without improving filter selectivity.

It has been recognised, for example in U.S. Pat. No. 5,471,178, that the stop band performance for a ladder filter is determined in part by the static capacitance ratio between the series and shunt resonators, as the resonators act as a capacitive voltage divider at frequencies removed from the resonant frequencies.

SUMMARY OF THE INVENTION

According to the invention, there is provided a ladder filter comprising a plurality of bulk acoustic wave resonators, the resonators comprising a plurality of series resonators in series between an input port and an output port of the filter, and one or more shunt resonators each connected between a junction between two series resonators and a common terminal, the series resonators comprising an input series resonator connected to the input port and an output series resonator connected to the output port, and wherein the or each shunt resonator has a static capacitance which is more than four times the static capacitance of the input or output series resonators.

The ladder filter of the invention provides increased shunt resonator capacitance (compared to conventional designs in which the series and shunt resonators have substantially the same area). This reduces the effective coupling across the section thereby enabling a smaller number of series-shunt filter sections to be used to achieve good stop-band rejection, while still providing good performance in the pass-band. The filter of the invention can be impedance matched to both input and output impedances of the filter, so as to minimise the pass-band insertion loss. The increased shunt capacitance does, however, reduce the filter bandwidth, and the invention is based on the recognition that filter bandwidth can be traded for improved out-of-band rejection.

The series resonators may further comprise one or more intermediate series resonators having a static capacitance which is approximately half the static capacitance of the input or output series resonators. In this way, the ladder filter can be made up of identical T-section building blocks. For equal input and output impedances, the input and output series resonators preferably have the same static capacitance.

Each bulk acoustic wave resonator preferably comprises a layer of piezoelectric material sandwiched between two metal layers in which electrodes are formed, the piezoelectric material being provided over a plurality of acoustically mismatched layers mounted on an insulating substrate. The piezoelectric material may comprise PZT.

The ladder filter may be used to define a band pass filter having a centre frequency in the band pass region, wherein the series and shunt resonators are tuned such that the series resonators have an impedance minimum at the centre frequency and the shunt resonators have an impedance maximum at the centre frequency. This provides maximum coupling between the input and the output at the resonant frequency.

The series and shunt resonators may be designed to satisfy:

$C_{series} = (\sqrt{2}\omega_{shunt})/((\omega_{series}^2 R_o m)$ $C_{shunt} = (\sqrt{2}\omega_{shunt} m)/((\omega_{series}^2 R_o)$ where $C_{series}$ is the static capacitance of the input and output series resonator, $C_{shunt}$ is the static capacitance of the or each shunt resonator, $\omega_{series}$ and $\omega_{shunt}$ are the angular resonant frequencies respectively of the series and shunt resonators, $R_o$ is a desired input and output impedance of the filter, and m is a parameter which is equal to the square root of the ratio of shunt-to-series static capacitance.

This arrangement enables the filter to be matched to a desired input and output impedance to achieve low pass band loss. The greater the value of m, the greater rejection in the stop-band achieved by each resonator stage. Selection of the ratio m dictates the capacitance of the series and shunt resonators, and the areas of these components over the substrate can then be selected accordingly. There is, however, a practical upper bound on m which depends on the coupling factor K of the piezo-electric film, resonator quality factor Q, and the required band-width. The value of m is greater than or equal to 2 according to the invention, and may take a value between 2 and 32.

The invention also provides a radio frequency band pass filter comprising a ladder filter of the invention. A radio frequency receiver and/or transmitter may use such a band pass filter.

BRIEF DESCRIPTION OF THE DRAWING

Examples of the invention will now be described in detail with reference to the accompanying drawings, in which.

DESCRIPTION OF THE PREFERRED EMBODIMENTS

The invention is based on the recognition that improved performance can be obtained by adjusting the relative areas of the series and shunt resonators over the substrate, thereby enabling selection of the static capacitance values. In particular, increased shunt resonator capacitance is provided to reduce the effective coupling across the section thereby enabling a smaller number of series-shunt filter sections to used.

The trade-off is that the filter band-width is then narrowed. However, if a very strongly piezo-electric material, such as PZT, is used to form the layer 10, the available bandwidth is greater than that required in many applications, and therefore the extra band-width can be traded usefully for a deeper stopband level.

Figure 1:
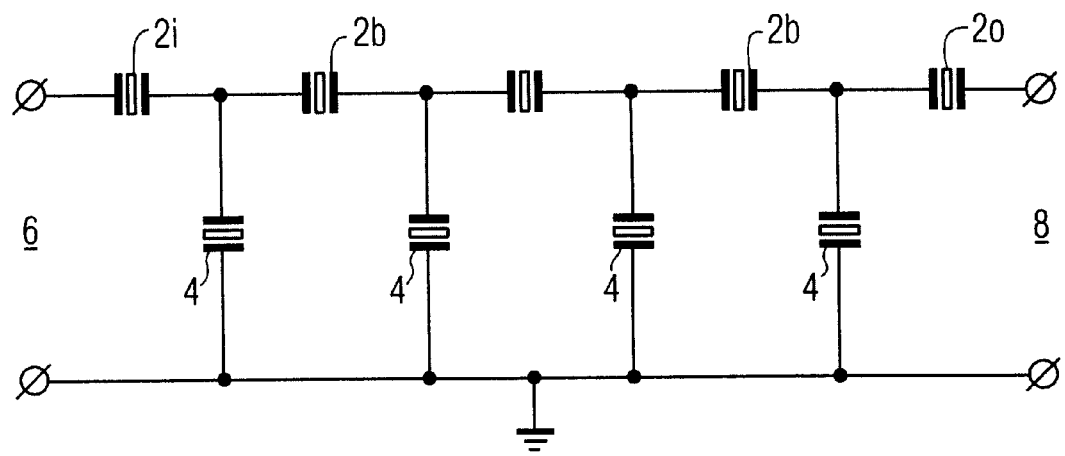
FIG. 1 is a schematic diagram showing a ladder filter with five series and four shunt resonators.

This relationship is explained as follows. Low pass-band insertion loss in an individual T-section requires (a) high-Q factor resonators, and (b) a good electrical match to its terminations (either the filter termination or the neighbouring T-section). High Q factor resonators can be achieved with appropriate thin-film technology. The invention exploits the second condition, and enables selection of the relative static capacitance values in the series and shunt sections of a ladder filter design (such as shown in FIG. 1) whilst ensuring electrical matching of the filter sections so that they have desired input and output impedances.

Application of "image-parameter" theory shows that a T-section, comprising two identical series resonators and an intermediate shunt resonator, is perfectly matched to real-valued terminating impedance $R_o$ (typically 50 Ω) if:

$C_{series} = (\sqrt{2}\omega_{shunt})/((\omega_{series}^2 R_o m)$ $C_{shunt} = (\sqrt{2}\omega_{shunt} m)/((\omega_{series}^2 R_o)$ where $C_{series}$ is the static capacitance of each of the two identical series resonators, $C_{shunt}$ is the static capacitance of the shunt resonator, ($\omega$series and $\omega_{shunt}$ are the (angular) resonant frequencies respectively of the series and shunt resonators, and m is a parameter which is equal to the square root of the ratio of shunt-to-series static capacitance.

The above impedance-matching condition gives the lowest possible pass-band loss, and is satisfied for all values of m. However, to achieve the lowest stop-band level m should be as high as possible. There is, however, a practical upper bound on m which depends on the coupling factor K of the piezo-electric film, resonator quality factor Q, and the required band-width. Increasing m reduces the effective coupling across the section, and hence also the filter band-width. The important relationship is that this band-width can be traded for improved out-of-band rejection. For strongly piezo-electric materials the flexibility provided by the invention is considerable.

EXAMPLES—GENERAL

Figure 3:
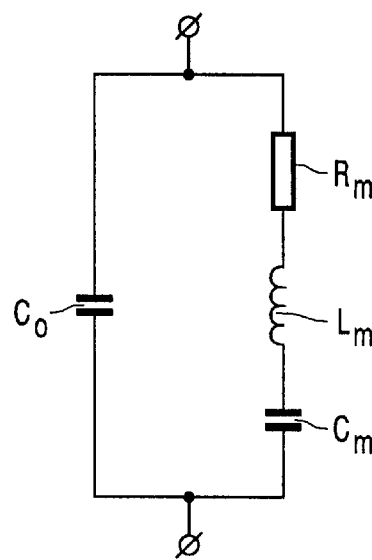
FIG. 3 shows an electrical equivalent circuit for a single (BAW) resonator.

The design parameters for filters designed according to the invention are m, Q, K and the number N of T-sections. Examples are given here to illustrate relationships between these quantities. These examples are based on the resonator equivalent circuit shown in FIG. 3. It is assumed, for the purpose of example only, that the desired centre frequency and terminating impedance level are 1 GHz and 50 Ω, respectively. The component values in the equivalent circuit are thus chosen such that the above two equations are satisfied for $R_o$=50 Ω, and the series and shunt resonators of each T-section respectively have their resonance (impedance minimum) and anti-resonance (impedance maximum) frequencies at 1 GHz.

In each example, the insertion loss (absolute value of scattering parameter S21) is plotted as a function of frequency, and plots are given for m=0.25, 0.5, 1.0, 2.0, 4.0, 8.0 and 16.0. Arrows 30 in FIGS. 4, 5, 6 and 7 show the effect of increasing the value of m.

Example 1

Figure 4:
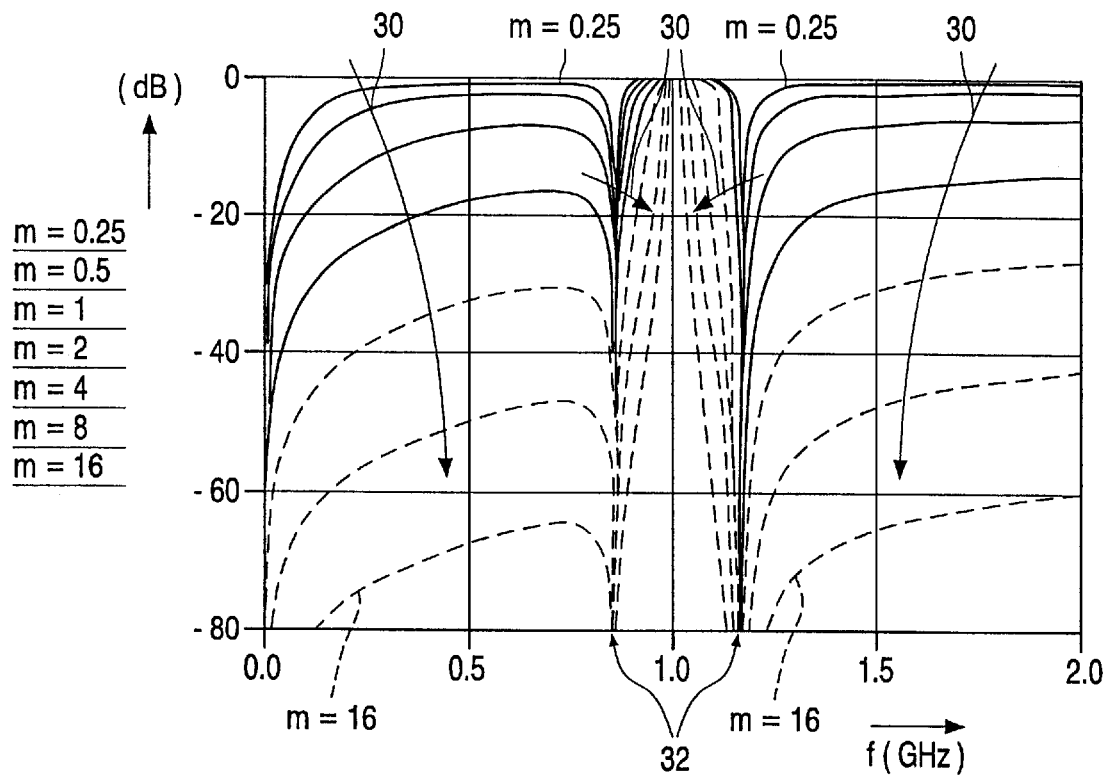
FIG. 4 shows the frequency response for a first series of examples of ladder filter of the invention and having a single T-section.

FIG. 4 shows the results for a resonator design having N=1 (a single T section) and infinite Q (i.e. loss-less resonators). K is assumed to be 0.6 which can be achieved with PZT thin films. The impedance-matching in midband is seen to be perfect (i.e. zero dB loss) for all values of m. The stopband level increases with m, up to a value >60 dB for a single T-section with m=16. The band-width of the pass band decreases with increasing m, but is still greater than 2% for the m=16 case.

It can be seen from the fact that the deep nulls 32 are independent of m, that band-width cannot exceed some fundamental value. This maximum band-width depends on the piezo-electric coupling coefficient K.

Example 2

Figure 5:
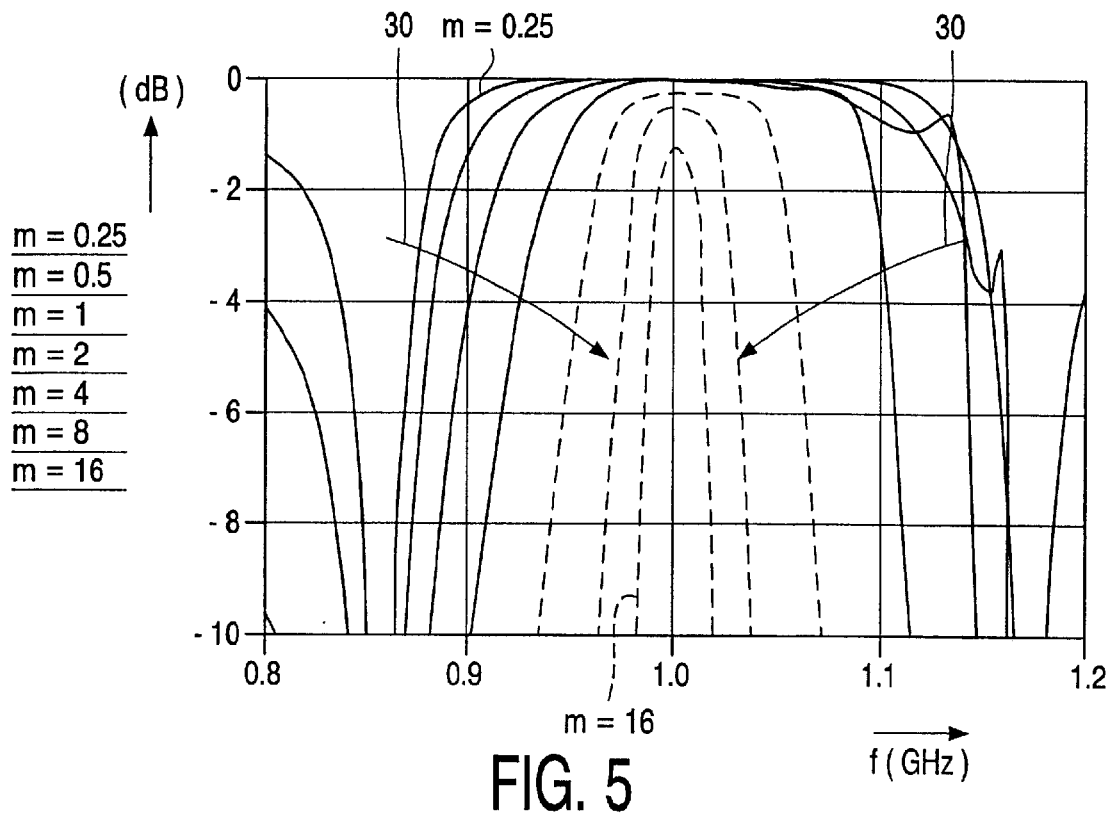
FIG. 5 shows the frequency response for a second series of examples of ladder filter of the invention and having a single T-section.

FIG. 5 shows an enlarged portion of the band-pass region for a filter design equivalent to example 1, but assuming Q=500, which is achievable in practice. Finite Q resonators introduce some loss, which increases to about 1.5 dB in mid band for the narrowest band-width case (i.e. the highest value of m at m=16). The trade-off between band-width, insertion loss and stop-band level is clear.

Example 3

Figure 6:
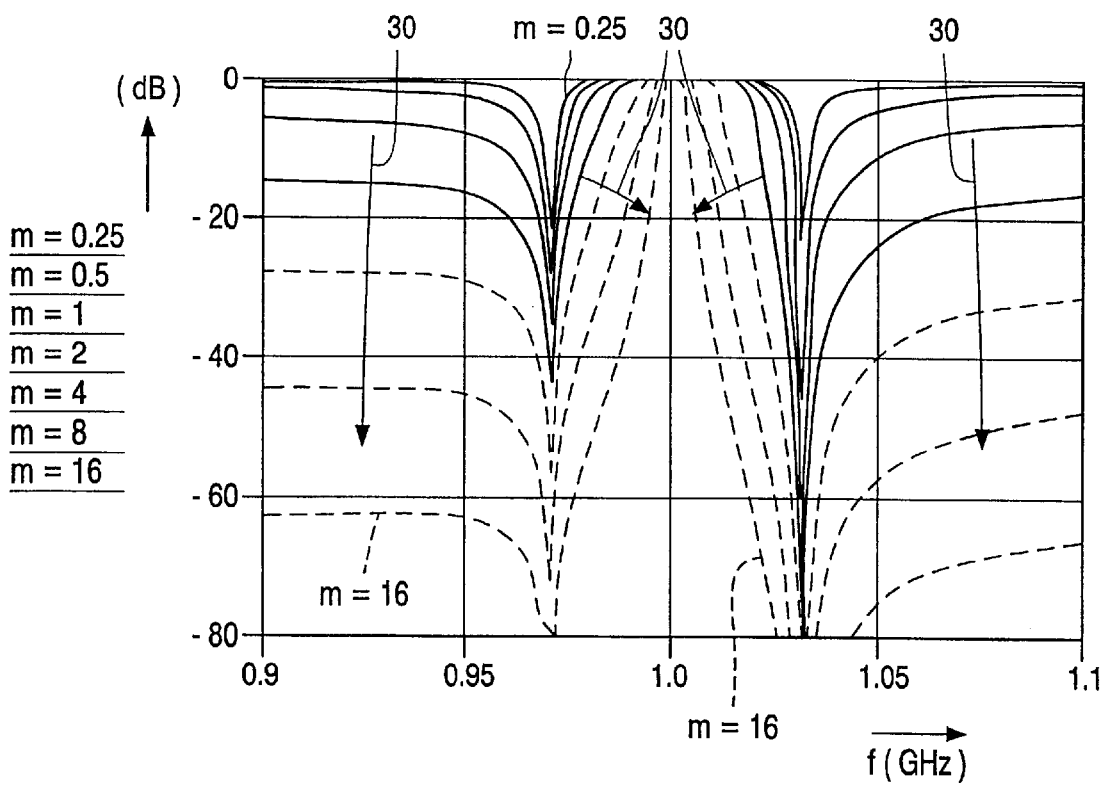
FIGS. 6 and 7 show the frequency response for a third series of examples of ladder filter of the invention and having a single T-section.
Figure 7:
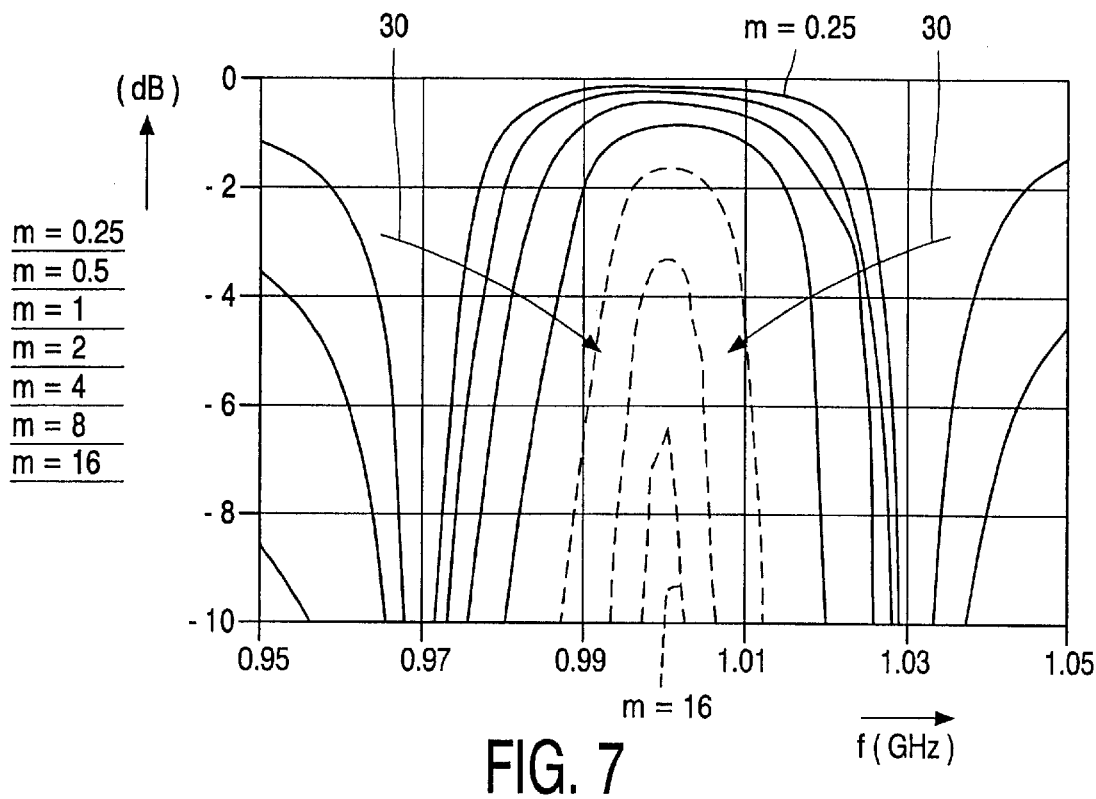

FIGS. 6 and 7 show plots for an example in which K=0.25, which is a value that can be achieved using aluminium nitride (AlN) piezo-electric films. The quality factor of 500 is again assumed and for a single T section (N=1). The lower coupling coefficient, in this case, means that the maximum achievable bandwidth is only about 5%. There is therefore much less scope for trading excess band-width for other design parameters. The invention is therefore most useful for the more strongly piezo-electric materials such as PZT.

Figure 8:
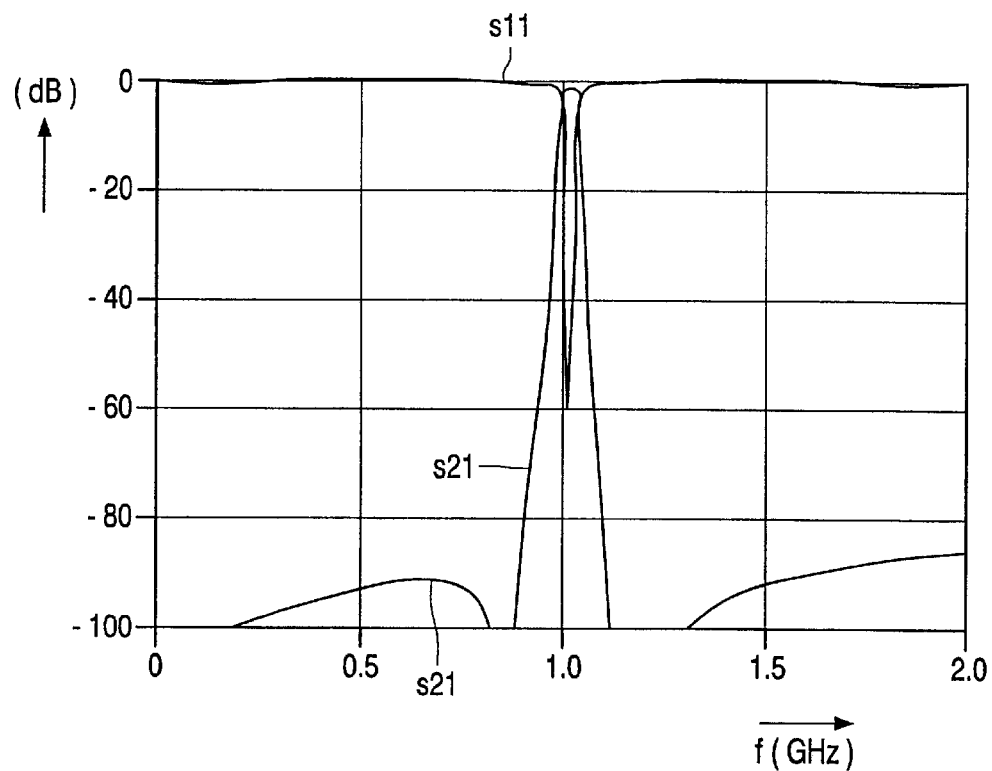
FIG. 8 shows the frequency response for an example of ladder filter of the invention using more than one T section.

To illustrate the effect of using the T-sections in a ladder filter design, FIG. 8 illustrates the frequency response of two cascaded T-sections with m=8. Here PZT resonators with K=0.6 and Q=500 are assumed. The above model shows about 1.3 dB mid-band insertion loss, >15 dB return loss (absolute value of scattering parameter S11), about 5% fractional band-width, and >80 dB ultimate stop-band.

The filters of the invention are applicable to the frequency range 0.5 GHz to 10 GHz. Some of the most important wireless standards are included in this range, mostly in the region of 2 GHz which is a very natural frequency for this technology. Many applications based on these standards require highly selective low-loss front-end filters.

Figure 2:
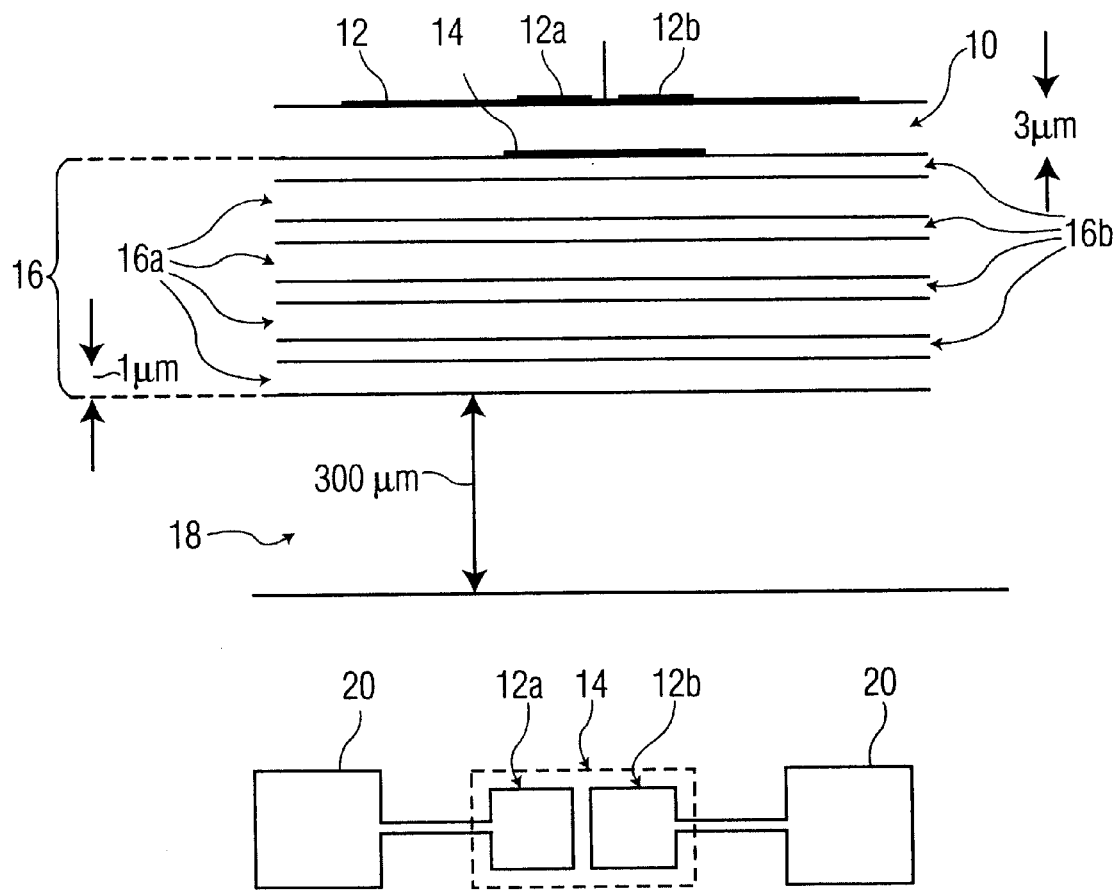
FIG. 2 shows the design of a known solidly mounted bulk acoustic wave (BAW) resonator.

As will be clear from the examples and discussion above, the ladder filter of the invention may be implemented using a variety of resonator designs and materials within those resonator designs. In order to implement the selected static capacitance ratio, the area of the resonator in question simply needs to be selected accordingly. This can be achieved simply by appropriate patterning of the upper electrode layer 12 for the resonator design shown in FIG. 2. However, there are other ways of altering the static capacitance, which may involve having different thickness of piezoelectric layer provided the desired resonant frequencies can be achieved.

As mentioned above, the series and shunt resonators are tuned to slightly different frequencies. This may be achieved by providing additional layers over the electrode layer, or again by altering the thickness or composition of the piezo-electric layer for the different types of resonator.

Solidly mounted BAWs have been described in detail in this application. However, the invention may be applied equally to surface membrane resonators.

The specific examples above have been selected to enable easy comparison, and for this reason all examples are directed to filters centred on 1 GHz and with 50 Ohm desired output impedance. These parameters will of course be selected with the specific application of the filter in mind.

Various other modifications will be apparent to those skilled in the art.

What is claimed is:

1. A ladder filter comprising a plurality of bulk acoustic wave resonators, the resonators comprising a plurality of series resonators in series between an input port and an output port of the filter, and one or more shunt resonators each connected between a junction between two series resonators and a common terminal, the series resonators comprising an input series resonator connected to the input port and an output series resonator connected to the output port, and wherein the series and shunt resonators are designed to satisfy:

$$C_{series} = (\sqrt{2}\omega_{shunt})/(\omega_{series}^2 R_o m)$$

$$C_{shunt} = (\sqrt{2}\omega_{shunt} m)/(\omega_{series}^2 R_o)$$

where $C_{series}$ is the static capacitance of the input and output series resonators;

$C_{shunt}$ is the static capacitance of the or each shunt resonator, $\omega_{series}$ and $\omega_{shunt}$ are the angular resonant frequencies respectively of the series and shunt resonators, $R_o$ is a desired input and output impedance of the filter, and m is a parameter which is equal to the square root of the ratio of shunt-to-series static capacitance.

2. A ladder filter as claimed in claim 1, wherein the series resonators further comprise one or more intermediate series resonators having a static capacitance which is approximately half the static capacitance of the input or output series resonators.

3. A ladder filter as claimed in claim 2, wherein the input and output series resonators have the same static capacitance.

4. A ladder filter as claimed in claim 1, wherein each bulk acoustic wave resonator comprises a layer of piezoelectric material sandwiched between two metal layers in which electrodes are formed, the piezoelectric material being provided over a plurality of acoustically mismatched layers mounted on an insulating substrate.

5. A ladder filter as claimed in claim 4, wherein the piezoelectric material comprises PZT.

6. A ladder filter as claimed in claim 1 comprising a band pass filter having a centre frequency in the band pass region, wherein the series and shunt resonators are tuned such that the series resonators have an impedance minimum at the centre frequency and the shunt resonators have an impedance maximum at the centre frequency.

7. A ladder filter as claimed in claim 1, wherein the or each shunt resonator has a static capacitance which is more than four times the static capacitance of the input or output series resonators.

8. A radio frequency band pass filter comprising a ladder filter as claimed in claim 1.

9. A radio frequency receiver and/or transmitter device comprising a band pass filter as claimed in claim 8.

* * * * *